US012382733B2

(12) United States Patent
Boriskina et al.

(10) Patent No.: US 12,382,733 B2
(45) Date of Patent: Aug. 5, 2025

(54) FLEXO-ELECTRIC BROADBAND PHOTO-DETECTORS AND ELECTRICAL ENERGY GENERATORS

(71) Applicant: Massachusetts Institute of Technology, Cambridge, MA (US)

(72) Inventors: Svetlana V. Boriskina, Winchester, MA (US); Bruno Lorenzi, Ponte San Pietro (IT); Gang Chen, Carlisle, MA (US); Yoichiro Tsurimaki, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 920 days.

(21) Appl. No.: 17/463,483

(22) Filed: Aug. 31, 2021

(65) Prior Publication Data
US 2022/0173303 A1    Jun. 2, 2022

Related U.S. Application Data

(60) Provisional application No. 63/072,365, filed on Aug. 31, 2020.

(51) Int. Cl.
*H10F 30/28*     (2025.01)
*H10N 30/85*     (2023.01)

(52) U.S. Cl.
CPC ......... *H10F 30/2877* (2025.01); *H10N 30/85* (2023.02)

(58) Field of Classification Search
CPC ..... Y02E 10/50; Y02E 10/543; Y02E 10/544; Y02E 10/546; Y02E 10/547; Y02E 10/545
See application file for complete search history.

(56) References Cited

U.S. PATENT DOCUMENTS 8,330,931 B2 * 12/2012 Coles .................... G02F 1/1393
                                                    349/185
10,297,707 B1 * 5/2019 Globus ................. H10F 77/127
(Continued)

FOREIGN PATENT DOCUMENTS

WO    WO-2018150160 A1 *  8/2018  ......... H01L 31/0216

OTHER PUBLICATIONS

Yucong Liu, Bulk photovoltaic effect at infrared wavelength in strained Bi2Te3 films, Dec. 1, 2016, APL Mater, 4 (12) (Year: 2016).*

(Continued)

*Primary Examiner* — Oluseye Iwarere
*Assistant Examiner* — Soorena Kefayati
(74) *Attorney, Agent, or Firm* — Barnes & Thornburg, LLP

(57) ABSTRACT

Photo-detectors disclosed include at least one of a thin film or a heterostructure of photo-sensitive material and a pair of Ohmic contacts coupled to the at least one of the thin film or the heterostructure. The at least one of the thin film or the heterostructure is configured to be under a strain gradient to induce shift current flow within the material to perform photo-detection in a frequency range that includes a mid-infrared frequency range. The photo-detectors provided for can include a variety of configurations, such as a lateral configuration or a vertical configuration, and can operate in self-powered and negative illumination regimes. Associated methods are also provided, which can include inducing a strain gradient and performing photo-detection in a frequency range that includes a mid-infrared frequency range.

20 Claims, 6 Drawing Sheets

(56) References Cited

U.S. PATENT DOCUMENTS

| | | | | |
|---|---|---|---|---|
| 2006/0157733 | A1* | 7/2006 | Lucovsky | H10D 64/691 257/E29.151 |
| 2011/0204214 | A1* | 8/2011 | Bahir | H10F 30/21 257/431 |
| 2012/0145996 | A1* | 6/2012 | Ting | H10F 71/1276 257/E29.022 |
| 2012/0248412 | A1* | 10/2012 | Mitin | B82Y 20/00 977/932 |
| 2014/0060643 | A1* | 3/2014 | Martin | B01J 23/002 502/1 |
| 2015/0207011 | A1* | 7/2015 | Garnett | H10F 10/162 136/255 |
| 2016/0111567 | A1* | 4/2016 | Shi | H10F 10/18 257/441 |
| 2016/0276528 | A1* | 9/2016 | Kizhaev | H01L 21/0262 |
| 2017/0301819 | A1* | 10/2017 | Yao | H10F 99/00 |
| 2018/0233619 | A1* | 8/2018 | Reverchon | H10F 30/222 |
| 2018/0277695 | A1* | 9/2018 | Garten | H10K 85/50 |
| 2019/0058068 | A1* | 2/2019 | Spanier | H10K 30/83 |
| 2019/0277703 | A1* | 9/2019 | Valouch | H10F 77/1237 |
| 2020/0220036 | A1* | 7/2020 | Azize | H10F 71/1274 |
| 2020/0321484 | A1* | 10/2020 | Gao | H10F 30/221 |
| 2021/0167244 | A1* | 6/2021 | Razeghi | H10F 71/1272 |

OTHER PUBLICATIONS

Yang, MM, Strain-gradient mediated local conduction in strained bismuth ferrite films, Jun. 26, 2019, Nat Commun 10, 2791 (Year: 2019).*

Yucong Liu, Bulk photovoltaic effect at infrared wavelength in strained Bi2Te3 films, Dec. 1, 2016, APL Mater, 126104, Dec. 1, 2016 (Year: 2016).*

Alvarez, et al., "Calibration Technique for Polarization-Sensitive Lidars," J. Atmos. Ocean. Technol., vol. 23, No. 5, pp. 683-699, May 2006.

Austin, "The Optical Properties of Bismuth Telluride," Proc. Phys. Soc., vol. 72, No. 4, pp. 545-552, Oct. 1958.

Belinicher et al., "The photogalvanic effect in media lacking a center of symmetry," Sov. Phys. Uspekhi, vol. 23, No. 3, pp. 199-223, Mar. 1980.

Boberl et al., "IV-VI resonant-cavity enhanced photodetectors for the mid-infrared," Semicond. Sci. Technol. 19, LI 15-LI 17, 2004.

Boriskina et al., "Heat meets light on the nanoscale," Nanophotonics 5, 134-160, 2016.

Boriskina, "Optics on the Go," Opt. Photonics News, vol. 28, No. 9, p. 34, Sep. 2017.

Boriskina, et al., "Roadmap on optical energy conversion," J. Opt., vol. 18, No. 7, p. 073004, Jul. 2016.

Cazzanelli et al., "Second-harmonic generation in silicon waveguides strained by silicon nitride," Nat. Mater. 11, 148-154, 2012.

Cross, "Flexoelectric effects: Charge separation in insulating solids subjected to elastic strain gradients," J. Mater. Sci. 41, 53-63, 2006.

Flynn, et al., "Novel polarization-sensitive micropulse lidar measurement technique," Opt. Express, vol. 15, No. 6, p. 2785, Mar. 2007.

Guttmann et al., "Mechanical properties of thermoelectric materials for practical applications," in Bringing Thermoelectricity into Reality, InTech, 2018.

Han, et al., "Enhanced Switchable Ferroelectric Photovoltaic Effects in Hexagonal Ferrite Thin Films via Strain Engineering," ACS Appl. Mater. Interfaces, vol. 10, No. 2, pp. 1846-1853, Jan. 2018.

Hong, et al., "Self-Powered Ultrafast Broadband Photodetector Based on p-n Heterojunctions of CuO/Si Nanowire Array," ACS Appl. Mater. Interfaces, vol. 6, No. 23, pp. 20887-20894, Dec. 2014.

Hsu, et al., "Entropic and near-field improvements of thermoradiative cells," Sci. Rep., vol. 6, p. 34837, Oct. 2016.

Inamoto et al., "Experimental and first-principles study of the electronic transport properties of strained Bi2Te3 thin films on a flexible substrate," J. Appl. Phys. 120, 125105, 2016.

Jiang et al., "Flexoelectric nano-generator: Materials, structures and devices," Nano Energy 2, 1079-1092, 2013.

Kim et al., "The multilayer-modified Stoney's formula for laminated polymer composites on a silicon substrate," J. Appl. Phys. 86, 5474-5479, 1999.

Kim et al., "Thermal gradient induced flexoelectric effects in bulk Ba,167Sr0 33 Ti 03," Appl. Phys. Lett. 108, 192902, 2016.

Klein et al., "Strains and stresses in multilayered elastic structures: The case of chemically vapor-deposited ZnS/ZnSe laminates," J. Appl. Phys. 87, 2265-2272, 2000.

Lamminpaa et al., "Characterization of germanium photodiodes and trap detector," Meas. Sci. Technol. 17, 908-912, 2006.

Langford et al., "Scherrer after sixty years: A survey and some new results in the determination of crystallite size," J. Appl. Crystallogr. 11, 102-113, 1978.

Lei et al., "Progress, challenges, and opportunities for HgCdTe infrared materials and detectors," Appl. Phys. Rev. 2, 41303, 2015.

Liu et al., "Anomalous thermoelectricity in strained Bi2Te3 films," Sci. Rep. 6, 1-7, 2016.

Liu et al., "Low electron scattering potentials in high performance Mg2Si0 45Sn,, 55 based thermoelectric solid solutions with band convergence," Adv. Energy Mater. 3, 1238-1244, 2013.

Liu, et al., "Ultrasensitive flexible near-infrared photodetectors based on Van der Waals Bi2Te3 nanoplates," Appl. Surf. Sci., vol. 484, pp. 542-550, Aug. 2019.

Mallampati et al., "Role of surface in high photoconductive gain measured inZnO nanowire-based photodetector," J. Nanoparticle Res. 17, 1-10, 2015.

Narvaez et al., "Enhanced flexoelectric-like response in oxide semiconductors," Nature 538, 219-221, 2016.

Olivares et al., "Enhancing Pockets effect in strained silicon waveguides," Opt. Express 27, 26882-26892, 2019.

Rashad et al., "Structure evaluation of bismuth telluride (Bi2 Te3) nanoparticles with enhanced Seebeck coefficient and low thermal conductivity," Mater. Res. Innov. 22, 315-323, 2018.

Ruhle, "Tabulated values of the Shockley-Queisser limit for single junction solar cells," Sol. Energy, vol. 130, pp. 139-147, Jun. 2016.

Santhanam et al., "Thermal-to-electrical energy conversion by diodes under negative illumination," Phys. Rev. B, vol. 93, No. 16, p. 161410, Apr. 2016.

Scherrer, "Bestimmnng der inneren Struktur und der Grolle von Kolloidteilchen mittels Rontgenstrahlen BT Kolloidchemie Ein Lehrbuch," in R. Zsigmondy, ed. (Springer Berlin Heidelberg, 1912), pp. 387-409.

Self-powered broadband photo-detection and persistant energy generation with junction-free strained Bi2Te3 thin films.

Sharma, et al., "High performance broadband photodetector using fabricated nanowires of bismuth selenide.," Sci. Rep., vol. 6, p. 19138, Jan. 2016.

Shockley et al., "Detailed balance limit of efficiency of p. n junction solar cells," J. Appl. Phys., vol. 32, No. 3, p. 510-, 1961.

Spanier, et al., "Power conversion efficiency exceeding the Shockley-Queisser limit in a ferroelectric insulator," Nat. Photonics, vol. 10, No. 9, pp. 611-616, Sep. 2016.

Stengel, "Microscopic response to inhomogeneous deformations in curvilinear coordinates," Nat. Commun. 4, 1-8, 2013.

Stengel, "Surface control of flexoelectricity," Phys. Rev. B—Condens. Matter Mater. Phys. 90, 201112, 2014.

Strandberg, "Theoretical efficiency limits for thermoradiative energy conversion," J. Appl. Phys., vol. 117, No. 5, p. 055105, Feb. 2015.

Sturman et al., "The Photovoltaic and Photorefractive Effects in Noncentrosymmetric Materials," Gordon and Breach Science Publishers, 1992.

Suo et al., "Mechanics of rollable and foldable film-on-foil electronics," Appl. Phys. Lett. 74, 1177-1179, 1999.

Tagantsev et al., "Flexoelectric effect in finite samples," J. Appl. Phys. 112, 44103, 2012.

Tagantsev, "Piezoelectricity and flexoelectricity in crystalline dielectrics," Phys. Rev. B, vol. 34, No. 8, pp. 5883-5889, Oct. 1986.

Tan et al., "Emerging technologies for high performance infrared detectors," Nanophotonics 7, 169-197, 2018.

Tauc et al., "Photo-piezoelectric effect in semiconductors," Czechoslov. J. Phys. 9, 572-577, 1959.

(56) References Cited

OTHER PUBLICATIONS

Tian et al., "Self-Powered Nanoscale Photodetectors," Small 13, 1701848, 2017.
Townsend et al., "Elastic relationships in layered composite media with approximation for the case of thin films on a thick substrate," J. Appl. Phys. 62, 4438-4444, 1987.
Wang et al., "Non-linear flexoelectricity in energy harvesting," Int. J. Eng. Sci. 116, 88-103, 2017.
Wang et al., "Resonant-cavity-enhanced mid-infrared photodetector on a silicon platform," Opt. Express 18, 12890, 2010.
Witting et al., "The thermoelectric properties of bismuth telluride," Adv. Electron. Mater. 5, 1800904, 2019.
Yang, et al., "Flexo-photovoltaic effect," Science (80-.)., vol. 360, No. 6391, pp. 904-907, May 2018.
Zubko et al., Flexoelectric effect in solids, Annu. Rev. Mater. Res. 43, 387-421, 2013.

\* cited by examiner

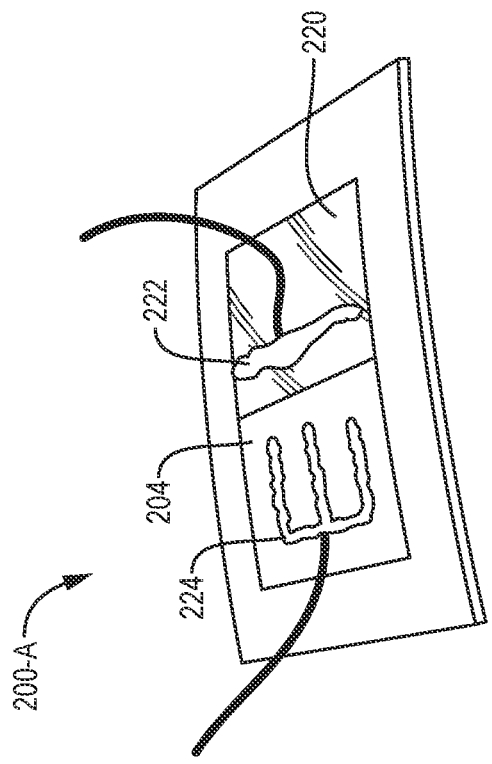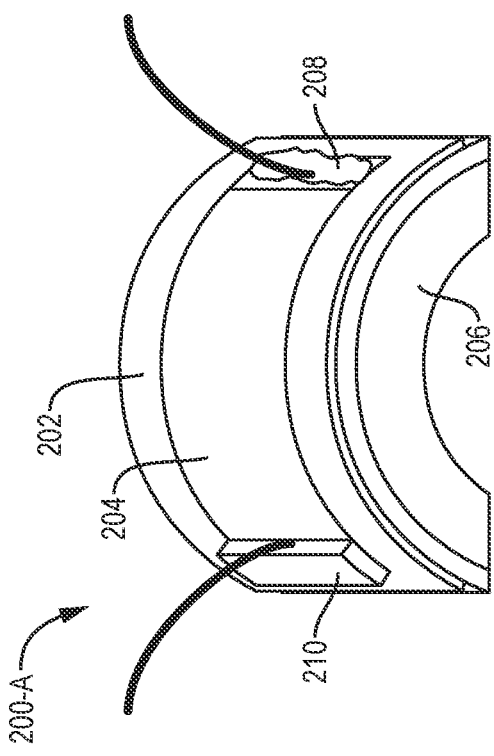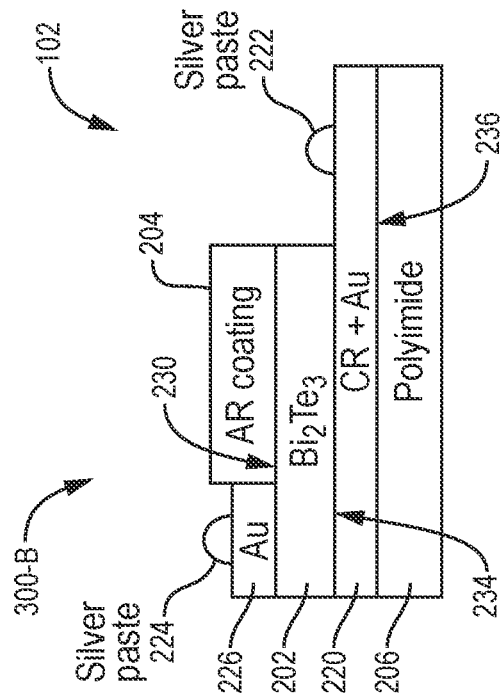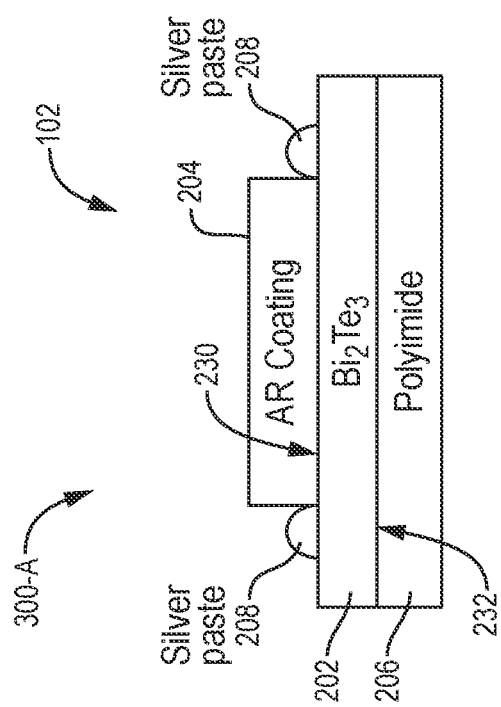

| Material | Diel. Constant |
|----------|----------------|
| HgCdTe | 15 |
| BaTiO$_3$ | 1200 |
| Bi$_2$Te$_3$ | 58 |
| PbTe | 400 |
| PbSe | 210 |
| SnTe | 1770 |

FIG. 7

FLEXO-ELECTRIC BROADBAND PHOTO-DETECTORS AND ELECTRICAL ENERGY GENERATORS

CROSS-REFERENCE TO RELATED APPLICATION

This application claims benefit of priority from a U.S. Provisional Application No. 63/072,365, filed Aug. 31, 2020, the disclosure of which is hereby incorporated by reference herein in its entirety.

STATEMENT REGARDING FEDERALLY SPONSORED RESEARCH OR DEVELOPMENT

This invention was made with Government support under Grant No. W911NF-13-D-0001 awarded by the Army Research Office (ARO). The Government has certain rights in the invention.

BACKGROUND

Infrared detectors and photon-to-electric-current energy converters (including solar and thermoradiative cells) usually rely on the use of either p-n or Schottky junctions to separate non-equilibrium photo-generated carriers. The p-n junctions are typically expensive, and often require cooling and external bias for operation. The efficiency of the standard p-n junction photovoltaic converter is constrained by the detailed balance (Shockley-Queisser, or SQ) limit, because the junction-induced photo-voltage does not exceed the electronic band gap of the junction material.

However, some materials exhibit what is known as 'bulk photovoltaic effect,' manifested as the spontaneous electrical polarization in the bulk of material, without any junction. The voltage induced due to such spontaneous polarization may exceed the electronic bandgap of the material by several orders of magnitude, offering opportunities for the photon energy harvesting beyond the SQ limit and efficient photodetection. This effect has been observed in non-centrosymmetric crystals, i.e., in piezoelectric and ferroelectric materials at temperatures below their phase transition point (i.e., below a corresponding Curie temperature of a given piezoelectric or ferroelectric material), as well as, during ferroelectric transitions induced by applying strain to the thin films of ferroelectric materials even at temperatures above the Curie temperatures of the ferroelectric materials. However, the use of ferroelectrics to develop bulk photovoltaic cells, or photo-detectors, has been limited, because most ferroelectric materials exhibit large electronic bandgaps, and, thus, cannot be used to detect infrared (or even low-frequency visible) light. Accordingly, there is a need to develop devices, including bulk photovoltaic cells or photo-detectors, and methods capable of better efficiencies and able to be produced more cost effectively, such as photo-detectors capable of detecting electrical signal and generating power without relying on p-n or Schottky junctions, capable of operating in a self-powered regime, and without applied voltage or active cooling.

SUMMARY

A photo-detector of the present disclosure comprises at least one active layer and a pair of Ohmic contacts. The active layer of the photo-detector device can be a thin film or a hetero structure of photo-sensitive material under a strain gradient. The active material layer(s) can include intrinsic, p-doped, and/or n-doped materials, where intrinsic materials include undoped materials (i.e., neither p- nor n-doped materials). The photo-detector can have an anti-reflective coating and/or can be combined with light focusing and anti-reflective structures such as, e.g., optical lenses, mirrors, or concentrators.

The photo-detector can include one or more of the following features. The photo-sensitive material of the active layer(s) can be a semiconductor. The photo-sensitive material can be a semi-metal. The photo-sensitive material can be a topological insulator. The photo-sensitive material can include a $Bi_2Te_{3-x}Se_x$ compound. The photo-sensitive material can include $Bi_2Te_3$. The photo-sensitive material can include a $Pb_xSn_{1-x}Se/Te$ compound. The photo-sensitive material can include a $Bi_2O_2Se/Te$ compound. The photo-sensitive material can include InAs. The photo-sensitive material can include an InGaAs compound. The photo-sensitive material can include InSb. The photo-sensitive material can include a Weyl semimetal, e.g., TaAs or $Co_3Sn_2S_2$. The photo-sensitive material can include a heterostructure, e.g., a quantum well structure composed of several interspaced thin films of semiconductors or semi-metals.

The photo-detector can include one or more of the following features. The strain gradient can be introduced by bending. The strain gradient can be introduced by multi-layer deposition of straining dielectric (e.g., $SiO_2$ or SiN) layers on top of the active material. The strain gradient can be introduced by micro-indentations. The strain gradient can be introduced by nano-indentations. The strain gradient can be introduced by active layer deposition on nano- and/or micro-structured substrates, e.g., modulated with grooves, pyramids, or otherwise textured.

The photo-detector can include one or more of the following features. An electrical signal can be detected in a self-powered regime, i.e., without applied voltage or active cooling. Electric power can be generated in a self-powered regime, i.e., without applied voltage or active cooling. An electrical signal can be detected under applied external bias. An electrical signal can be detected under active cooling. Electrical power can be generated under applied external bias. Electrical power can be generated under active cooling.

The photo-detector can include one or more of the following features. The photo-detector can provide polarization sensitivity of the detected light. An electrical signal can be detected in negative illumination. Electric power can be generated in negative illumination. Negative-illumination can occur when the detector is facing a lower-temperature surface. The lower-temperature surface can be the sky. The lower-temperature surface can be a mirror facing the sky.

A photo-detector can include a thin film of photo-sensitive material under strain gradient and Ohmic contacts. The photo-detector can include an anti-reflective coating. Example materials for the thin-film strain-gradient-induced photo-detectors may include, but are not limited to, low-bandgap semiconductors, semimetals, and/or topological insulators with gapless surface electron states such as $Bi_2Te_{3-x}Se_x$ compounds. These flexo-electric devices can serve as broadband detectors from the ultraviolet to the mid-infrared range. The flexo-electric devices according to the present disclosure may generate electric power during the daytime and the nighttime, for example, by either harnessing solar radiation (i.e., in the 'positive-illumination' solar-cell-like regime) or by emitting thermal radiation into the cold sky (i.e., in the 'negative-illumination' thermoradiative cell regime).

In some exemplary embodiments, a photo-detector includes at least one of a thin film or a heterostructure of photo-sensitive material and a pair of Ohmic contacts coupled to the at least one of the thin film or the heterostructure. The at least one of the thin film or the heterostructure is configured to be under a strain gradient to induce shift current flow within the material to perform photo-detection in a frequency range that includes a mid-infrared frequency range.

The photo-sensitive material can include one or more of: a semiconductor, a semi-metal, a $Bi_2Te_{3-x}Se_x$ compound, or a $Pb_xSn_{1-x}Se/Te$ compound. In some embodiments, at least one of the thin film or the heterostructure can be under a strain gradient. The strain gradient can be introduced in a variety of ways, including but not limited by at least one of bending, micro-indentations, nano-indentations, or deposition of straining overlayers.

The photo-detector can be configured to operate in a self-powered regime in response to being exposed to radiation. The self-powered regime can allow the photo-detector to perform photo-detection to detect light energy without applied voltage and/or active cooling. Alternatively, or additionally, the self-powered regime can allow the photo-detector to generate electric power. In some embodiments, the photo-detector can be configured to provide polarization sensitivity of detected light. Alternatively, or additionally, the photo-detector can generate power in the negative illumination regime, such as when the photo-detector is facing the sky.

The plurality of Ohmic contacts of the photo-detector can have a lateral configuration. In such a configuration, the plurality of Ohmic contacts can interface a same side of the at least one of the thin film or the heterostructure. In some embodiments the plurality of Ohmic contacts of the photo-detector can have a vertical configuration. In such a configuration, the plurality of Ohmic contacts can interface opposed sides of the at least one of the thin film or the heterostructure. The photo-detector can have a frequency-selective anti-reflective coating.

An exemplary method of the present disclosure comprises inducing a strain gradient in an active layer of a photo-detector to induce shift current flow within the active layer, and performing photo-detection in a frequency range that includes a mid-infrared frequency range. The photo-detector includes a pair of Ohmic contacts coupled to the active layer.

In at least some embodiments, the action of performing photo-detection can occur in a self-powered regime. Energy generation can occur in a negative illumination regime, such as when the photo-detector is facing the sky. Inducing a strain gradient can include at least one of bending, forming micro-indentations, forming nano-indentations, and/or depositing straining overlayers. The plurality of Ohmic contacts can interface a same side of the active layer, or they can interface opposed sides of the active layer.

BRIEF DESCRIPTION OF THE DRAWINGS

This disclosure will be more fully understood from the following detailed description taken in conjunction with the accompanying drawings, in which:

FIG. 2A is a photograph illustrating a top perspective view of another exemplary flexo-electric photo-detector, the photo-detector having Ohmic contacts arranged in a horizontal configuration;

FIG. 2B is a photograph illustrating a top perspective view of still another exemplary flexo-electric photo-detector, the photo-detector having Ohmic contacts arranged in a vertical configuration;

FIG. 3A is a schematic side view illustration of an exemplary layer arrangement of the flexo-electric photo-detector of FIG. 2A;

FIG. 3B is a schematic side view illustration of an exemplary layer arrangement of the flexo-electric photo-detector of FIG. 2B;

FIG. 7 illustrates Table 1 as referred to herein.

DETAILED DESCRIPTION

Figure 1A:
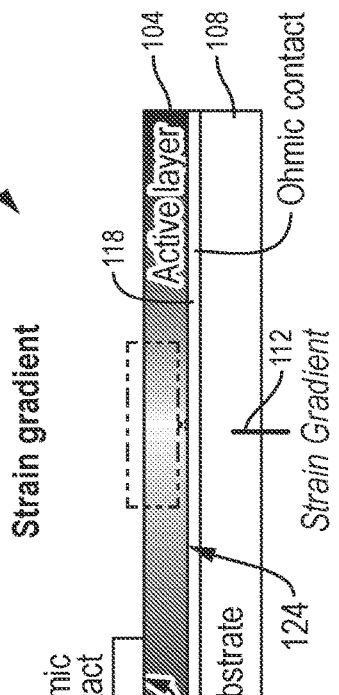
FIGS. 1A and 1B are schematic side view illustrations of exemplary flexo-electric photo-detectors according to the present disclosure.

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present disclosure is defined solely by the claims. The features illustrated or described in connection with one exemplary embodiment may be combined with the features of other embodiments. Such modifications and variations are intended to be included within the scope of the present disclosure. In the present disclosure, like-numbered components of various embodiments generally have similar features when those components are of a similar nature and/or serve a similar purpose, unless otherwise indicated or understood by a person skilled in the art. Terms like "thin" and "ultra-thin" are generally used herein interchangeably, unless otherwise indicated or understood by a person skilled in the art. A "thin" or "ultra-thin" film is considered to be a film having a thickness approximately in the range of about a monolayer of the material to about 2000 nanometers.

Flexo-electricity is an approach utilized herein to achieve energy harvesting in conjunction with thermoelectrics and solar photovoltaics. A flexo-electric effect—a spontaneous polarization produced by a strain gradient in a material—is a universal phenomenon that can be observed (at least to some degree) in all dielectrics, not only in piezo- and ferroelectric materials. A process and an apparatus achieve photodetection in a broad frequency range, as well as, electrical energy generation under solar and "negative" illumination. Efficient photo-detection occurs in the mid-infrared frequency range that exploits a photovoltaic effect in strained thin films of ordinary centrosymmetric materials. The bulk photovoltaic effect—traditionally observed only in non-centrosymmetric materials—has been detected in ordinary centrosymmetric materials through a flexo-electric effect, a material inversion symmetry breaking leading to shift current generation and/or spontaneous polarization produced by a strain gradient. The flexo-electric effect enables generation of electric current at the room temperature and without application of an external bias voltage in a simple, junction-free, cheap, lightweight, and flexible device configuration composed of an ultra-thin semiconductor layer and Ohmic contacts. This effect is harnessed to develop room-temperature infrared photo-detectors, which can operate, for example, in a self-powered regime for wearable technologies or in a biased regime for long-range Light Detection and Ranging (LIDAR) and night vision applications.

The developed simple, junction-free, cheap, lightweight, and flexible photo-detectors provided for herein comprise thin semiconductor layers and Ohmic contacts, require neither cooling nor applied bias for stable operation, and are not subject to the SQ efficiency limit. These devices can serve as broadband detectors from the ultraviolet to the mid-infrared frequency range (e.g., approximately in the range of about 3 Petahertz to about 10 Terahertz). They can also generate electric power during both the daytime and the nighttime, for example, by harnessing solar radiation and/or by emitting thermal radiation into the cold sky. The new technology offers many potential applications in night vision, wearable sensors, long-range LIDAR, and daytime/nighttime energy generation technologies.

Figure 1B:
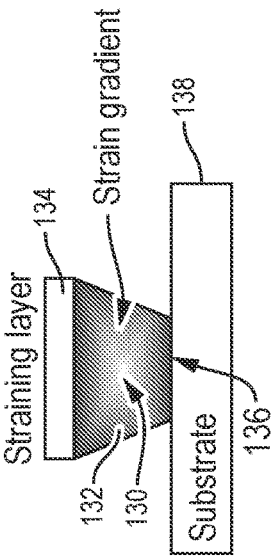

FIGS. 1A and 1B illustrate exemplary implementations 100-A and 100-B, respectively, of a photo-detector device 102 configured to operate in one of a "positive-illumination" regime or a "negative-illumination" regime in accordance with the present disclosure. As illustrated, for example, in FIG. 1A, the photo-detector device 102 includes an active layer 104 disposed on a substrate layer 108. The active layer 104 may be subjected to a predefined amount of strain, such as, but not limited to, strain introduced by a mechanical deformation, such as by bending, micro-indentations, nano-indentations, and/or deposition of straining overlayers. In some instances, the strain may be inhomogeneous, i.e., a strain that varies in magnitude at different points of the active layer 104. FIG. 1A illustrates an exemplary implementation 100-A of the photo-detector 102—sometimes referred to herein as Prototype I flexo-electric photo-detector—that comprises an active layer 104 of flexible photo-active material, the active layer 104 being subjected to an external strain gradient 112. Two Ohmic contacts 106 of the exemplary implementation 100-A are disposed on a top surface 114 of the active layer 104 and a top inset 120 of FIG. 1A diagrammatically illustrates a built-in electric field resulting from the applied film strain gradient. The exemplary implementation 100-A of the photo-detector 102 has a lateral configuration, meaning positioning of the Ohmic contacts 106 as illustrated in FIG. 1A causes electrical current generated by solar or thermal radiation and an internal flexo-electricity-mediated electric field to flow in the material in-plane (i.e., lateral) direction 122 of the active layer 104.

FIG. 1B illustrates the exemplary implementation 100-B of the photo-detector 102—sometimes referred to herein as Prototype II flexo-electric photo-detector. In particular, as illustrated in FIG. 1B, the thin-film flexo-electric device 102 consistent with the present disclosure may include Ohmic contacts having a vertical configuration. The second embodiment 100-B includes a first Ohmic contact 106 disposed on the top surface 114 of the active layer 104 and a second Ohmic contact 118 disposed at a bottom surface 124 of the active layer 104, forming a solar cell-like structure. Accordingly, while in the implementation 100-A the Ohmic contacts 106 are laterally aligned in the lateral configuration such that both Ohmic contacts 106 are disposed on the same surface 114, in the implementation 100-B the Ohmic contacts 106 are vertically aligned in the vertical configuration such that the two contacts 106 are on opposed surfaces 114, 124 of the active layer 104. In this vertical configuration, the photo-induced current flows in the material out-of-plane (i.e., vertical) direction 126 of the active layer 104.

Figure 1C:
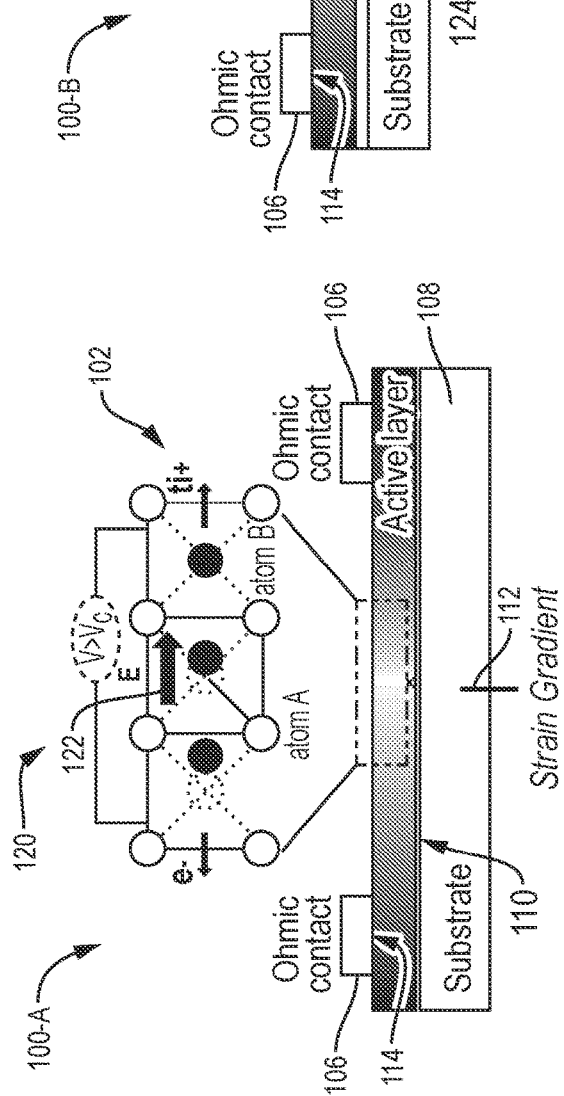
FIGS. 1C and 1D are schematic side view illustrations of exemplary implementations for inducing a gradient strain into the flexo-electric photo-detectors of FIGS. 1A and 1B, respectively.
Figure 1D:
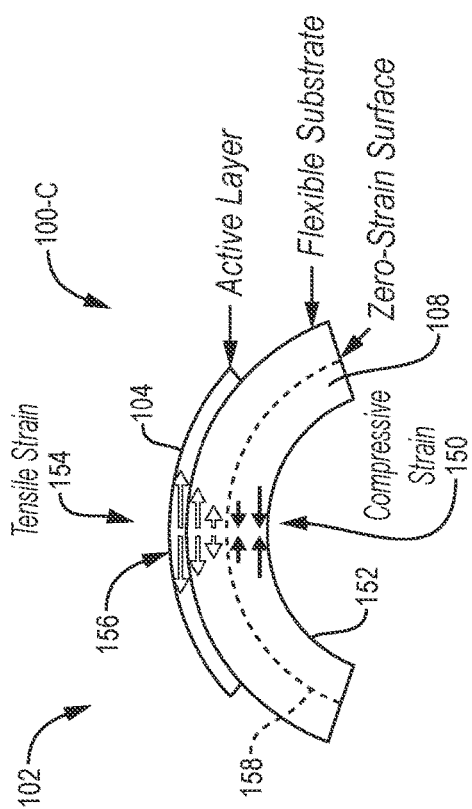

In either of the embodiments 100-A, 100B shown in FIGS. 1A and 1B, the strain gradient 122 can be realized via different types of deformations, including but not limited to bending deformations (for example, as illustrated and described in reference to FIG. 1C) or material crystal lattice deformation caused by lattice mismatch with neighboring material layers or the substrate on which the device is deposited (for example, as illustrated and described in reference to FIG. 1D).

FIG. 1C illustrates an exemplary embodiment 100-C in which the strain gradient is induced via bending of the thin-film substrate 128. Accordingly, inhomogeneous strain within the active layer 104 may be generated by a mechanical deformation—e.g., layer bending, as illustrated, for example, in FIG. 1C. Other examples of introducing mechanical deformation include by bending, micro-indentations, nano-indentations, and/or deposition of straining overlayers. Accordingly, the bending deformation induces compressive strain 150 at a bottom 152 of the photo-detector 102, and a tensile strain 154 on a top 156 of the photo-detector 102, with a zero-strain (neutral) surface 158 disposed between the compressive strain 150 area and the tensile strain 154 area. The fabrication process may also generate some residual strain gradients in the semiconductor film (i.e., caused by crystal dislocations or grain/domain boundaries and by the polyimide substrates shrinkage during the film deposition) in addition to the externally-applied bending strain. The in-plane and out-of-plane components of the strain tensor in the active layer 104 can be expressed according to Equations (1) and (2), such that:

$$\varepsilon_x = \varepsilon_r + (z - z_0) \cdot R_c^{-1}, \quad (1)$$

$$\varepsilon_z = -v\varepsilon_x/(1-v), \quad (2)$$

where z measures the distance across the device in the vertical direction from the bottom surface of the substrate, the neutral plane is at position $z_0$, $\varepsilon_r$ characterizes the residual strain existing in the sample prior to bending, and $(z-z_0) \cdot R_c^{-1}$ defines the bending contribution, which depends linearly on the distance from the neutral plane and is inversely proportional to a radius of the bending curvature.

v is the Poisson's ratio. The bending-induced strain gradient in the film can then be controlled by varying a curvature radius of the photo-detector 102 according to Equation (3), such that:

$$\delta \varepsilon = \frac{\partial \varepsilon_x}{\partial z} = R_c^{-1} \quad (3)$$

Inhomogeneous strain within the active layer 104 may be generated via in-situ strain engineering by active layer nano-structuring and straining layer(s) deposition, as illustrated, for example, in FIG. 1D. In particular, an exemplary embodiment 100-D where the in-situ strain gradient 130 is induced by active layer 132 micro/nanopatterning and deposition of a straining dielectric overlayer 134, where the active layer 132 is disposed on a surface 136 of a substrate layer 138.

FIG. 2A illustrates an exemplary implementation 200-A of the photo-detector 102 in which the Ohmic contacts have a lateral configuration, similar to the implementation 100-A illustrated in FIG. 1A, while FIG. 2B illustrates an exemplary implantation 200-B of the photo-detector 102 in which the Ohmic contacts have a vertical configuration, similar to the implementation 100-B illustrated in FIG. 1B. As illustrated in FIGS. 2A and 2B, materials forming the active layer 202 are thin films of $Bi_2Te_3$, deposited on a substrate layer 206 of flexible polyamide. An exemplary photo-detector 102 may be equipped with gold Ohmic contacts (see, e.g., FIG. 3B, gold Ohmic contacts 220, 226 arranged in a vertical configuration and silver paste deposits 222, 224 arranged in a lateral configuration) or silver Ohmic contacts (see, e.g., FIG. 3A, silver paste Ohmic contacts 208, 210). To improve light absorptance and emittance properties of the devices, the photo-detector 102 can be covered with an anti-reflective or anti-reflection layer 204, e.g., a silicon nitride anti-reflection film overcoat, having a predefined thickness, e.g., a thickness of about 800 nm; more generally, the thickness can be approximately in the range of about 10 nanometers to about 2000 nanometers. For the photo-detector application in the negative-illumination regime, the thickness of the anti-reflective layer 204 can be optimized to achieve efficient photon absorption (e.g., at or close to 100%), such as at frequencies just above the bulk electronic bandgap of a material of the active layer 202. For the photo-detector application in the positive-illumination regime, the thickness of the anti-reflective layer 204 can be optimized to achieve efficient photon absorption (e.g., at or close to 100%), such as at frequencies corresponding to frequencies of the detected light signal (e.g., a laser frequency in a LIDAR application). A person skilled in the art, in view of the present disclosures, will appreciate that the various values provided for herein, including but not limited to thicknesses, frequencies, and those related to efficiency, are at least dependent on the material(s) being used. Accordingly, more generally it will be appreciated that whatever is the active material bandgap, the absorption can be maximized at a frequency just above the bandgap. Typically materials are absorptive to a certain degree at all frequencies about the bandgap, but the present disclosures provides ways to maximize absorption. A person skilled in the art will understand how to determine the active material bandgap for the photo-detectors disclosed in or otherwise derivable from the present disclosures.

The anti-reflective layer 204 can be deposited, for example, using plasma-enhanced chemical vapor deposition (PECVD). The 1.5 micron-thick layers of bismuth telluride thin films can be deposited, for example, using either Direct Current (DC) magnetron sputtering and/or Radio Frequency (RF) magnetron sputtering, among other techniques. The layers of bismuth telluride thin films may be annealed in vacuum. For example, annealing can occur for approximately two hours at about 250° C. temperature. The annealing can improve material properties.

The $Bi_2Te_3$ thin films electrical resistance can be about 0.0005Ω per cm, and the active layer 202 charge carrier mobility can be about 10 $cm^2V^{-1} s^{-1}$. Either gold (Au) Ohmic contacts 220, 226, as illustrated in FIG. 3B, or silver (Ag) Ohmic contacts 208, 210, as illustrated in FIG. 3A, have been demonstrated to provide electrical performance of the devices with a linear I-V curve, although a person skilled in the art will appreciate other materials that can be used to achieve similar results, e.g., aluminum (Al) or platinum (Pl). The increasing level of strain gradient can be introduced to the samples by progressively reducing the distance between opposite sides of a substrate to bend the films (see FIG. 5A). The maximum strain gradient achieved in the prototypes under bending deformation was 0.887 $cm^{-1}$ (or 0.00887 $m^{-1}$). However, strain gradients of at least $10^3$ $m^{-1}$ or larger, including strain gradients as large as approximately in the range of about $10^6$ $m^{-1}$ to about $10^7$ $m^{-1}$, can be achieved, by way of non-limiting examples, via nano-patterning, nano-indentation, and/or at lattice-mismatched material interfaces.

FIGS. 3A and 3B provide schematic illustrations of thin-film flexo-electric photo-detectors 102 in the lateral and vertical configurations, respectively. An anti-reflective dielectric layer 204 can be disposed on a top surface 230 of the active layer 202 and can improve light absorptance in the active layer 202 disposed underneath. As just some examples, the active layer 202 materials can comprise SiN, $SiO_2$, and/or $MgF_2$, among others. The active layer 202 of the exemplary implementations 300-A, 300-B can include a thin-film of homogeneous or heterostructured material. Material of the active layer 202 can include low-gap semiconductor (e.g., PbTe), a topological insulator (e.g., $Bi_2Te_3$), or a semimetal (e.g., TaAs). The active layer 202 can be disposed on a top surface 232 of the substrate 206, as illustrated in the lateral configuration of FIG. 3A, or on a top surface 234 of the Ohmic contact 220, which can be disposed on a top surface 236 of the substrate 206, as illustrated in the vertical configuration of FIG. 3B. The substrate 206 can be of flexible polymer material, enabling bending of the active layer 202 of the photo-detector 102 to generate a strain gradient. A person skilled in the art will appreciate that the types of materials illustrated and/or otherwise identified in conjunction with the various layers are merely examples, and that other types of materials that can achieve similar properties to allow for the functions provided for herein may also be used. These materials can be arranged in multiple layers of a single material or combinations of materials, e.g., material layers arranged into a multilayer heterostructure comprising a metal layer, a ferroelectric insulator layer, and a semiconductor layer.

Figure 4A:
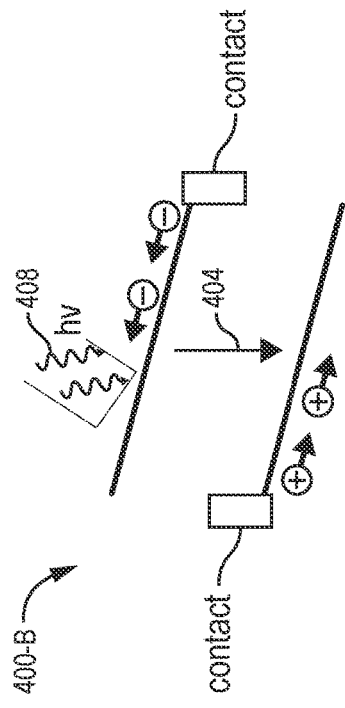
FIGS. 4A and 4B are schematic illustrations of exemplary operating regimes, self-powered and negative illumination, respectively, for each of the flexo-electric photo-detectors of FIGS. 1A, 1B, 2A, 2B, 3A, and 3B.
Figure 4B:
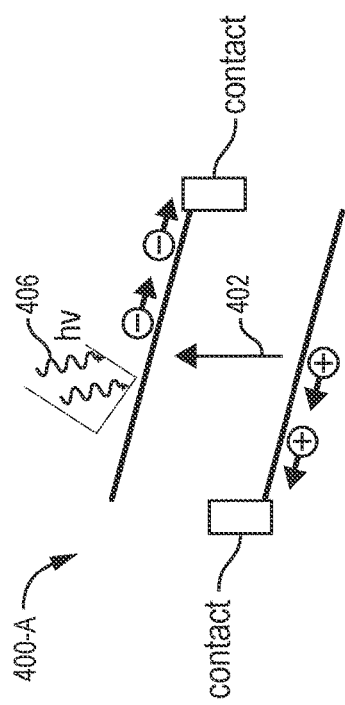

Each of the exemplary implementations 100-A, 100-B, 200-A, 200-B, 300-A, and 300-B of the photo-detectors 102 can operate under "positive" illumination conditions and/or "negative" illumination conditions such that the photo-detector 102 of the present disclosure harvests energy from the environment both in the daytime and in the nighttime. FIGS. 4A and 4B illustrate exemplary diagrams 400-A and 400-B, respectively, showing reciprocal energy-momentum space (i.e., energy on y-axis) and electron transition direction between energy levels for each of the "positive" and "negative" illumination scenarios. The exemplary diagram 400-A of FIG. 4A illustrates operation of the flexo-electric photo-detector 102 across the various illustrated and described implementations in the daytime (solar-cell-like) regime. The daytime regime of operation can be achieved, for example, if the photo-detector 102 is used as a thermo-photovoltaic cell to harvest the energy of a terrestrial thermal emitter. The photo-detector 102 can be facing a hotter object emitting radiation (either the sun or a thermal emitter), and the net radiative energy flux 406 can be in the direction towards the photo-detector 102.

Figure 4C:
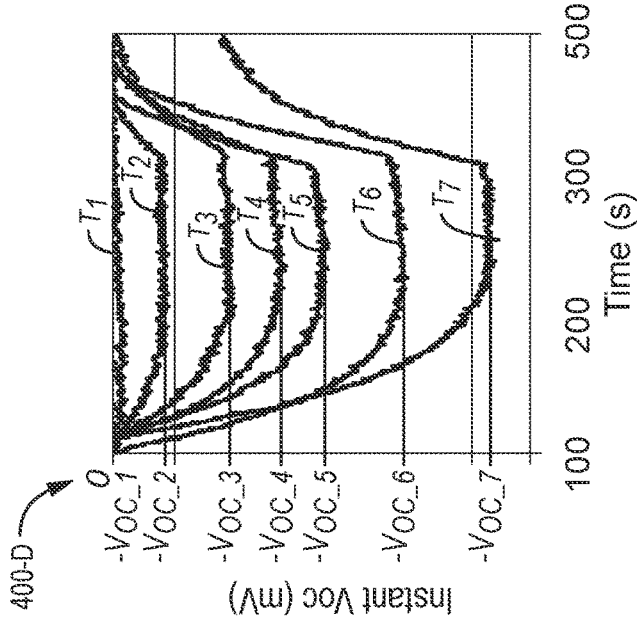
FIGS. 4C and 4D are graphs illustrating changes in photo-voltage of the flexo-electric photo-detector of the FIGS. 1A, 1B, 2A, 2B, 3A, and 3B over time during positive and negative illumination regimes, respectively.

FIG. 4C illustrates an increase in magnitude of open circuit photo-voltage $V_{OC}$ across the contacts of the photo-detector 102 with time that corresponds to an increase in temperature T of the photo-detector 102. For example, open circuit photo-voltage $V_{OC}$, measured when temperature of the photo-detector 102 is at a first temperature $T_1$, corresponds to a first open circuit photo-voltage $V_{OC\_1}$, and open circuit photo-voltage $V_{OC}$, measured when temperature of the photo-detector 102 is at a second temperature $T_2$, corresponds to a second open circuit photo-voltage $V_{OC\_2}$, with the second temperature $T_2$ being greater than the first temperature $T_1$ and the second open circuit photo-voltage $V_{OC\_2}$ a being greater than the first open circuit photo-voltage $V_{OC\_1}$. As another example, open circuit photo-voltage $V_{OC}$, measured when temperature of the photo-detector 102 is at a third temperature $T_3$, corresponds to a third open circuit photo-voltage $V_{OC\_3}$, with the third temperature $T_3$ being greater than the second temperature $T_2$ and the third open circuit photo-voltage $V_{OC\_3}$ being greater than the second open circuit photo-voltage $V_{OC\_2}$. As shown, a pattern of increase in magnitude of open circuit photo-voltage corresponding to an increase in temperature of the photo-detector 102 can continue with respect to temperatures $T_4$, $T_5$, $T_6$, and $T_7$ and open circuit photo-voltages $V_{OC\_4}$, $V_{OC\_5}$, $V_{OC\_6}$, and $V_{OC\_7}$.

Figure 4D:
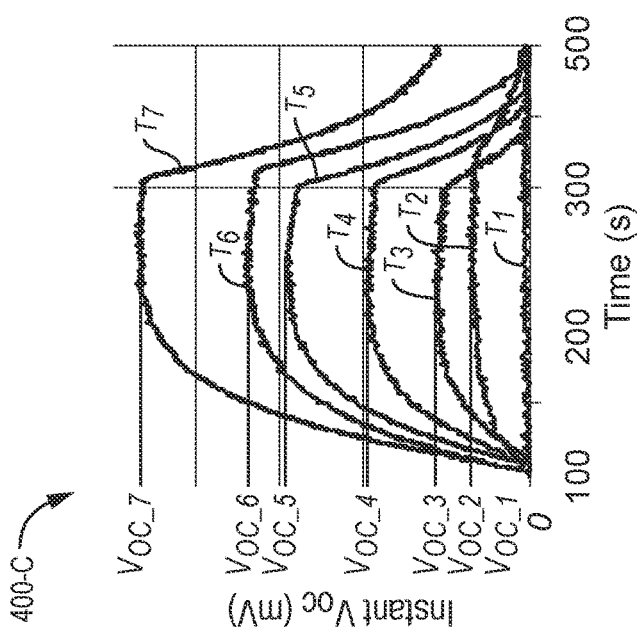

The exemplary diagram 400-B illustrates electron transition direction between energy levels during the thermoradiative-cell-like operation regime of the flexo-electric photo-detector 102 across the various illustrated and described implementations in situations in which the net radiative energy flux 408 is in the direction away from the photo-detector 102. In a manner comparable to FIG. 4C, FIG. 4D illustrates an increase in magnitude of open circuit photo-voltage $V_{OC}$ across the contacts of the photo-detector 102 with time that corresponds to an increase in temperature T of the photo-detector 102. For example, open circuit photo-voltage $V_{OC}$, measured when temperature of the photo-detector 102 is at a first temperature $T_1$, corresponds to a first open circuit photo-voltage $V_{OC\_1}$, and open circuit photo-voltage $V_{OC}$, measured when temperature of the photo-detector 102 is at a second temperature $T_2$, corresponds to a second open circuit photo-voltage $V_{OC\_2}$, with the second temperature $T_2$ being greater than the first temperature $T_1$ and the second open circuit photo-voltage $V_{OC\_2}$ being greater than the first open circuit photo-voltage $V_{OC\_2}$. As another example, open circuit photo-voltage $V_{OC}$, measured when temperature of the photo-detector 102 is at a third temperature $T_3$, corresponds to a third open circuit photo-voltage $V_{OC\_3}$, with the third temperature $T_3$ being greater than the second temperature $T_2$ and the third open circuit photo-voltage $V_{OC\_3}$ being greater than the second open circuit photo-voltage $V_{OC\_2}$. As shown, a pattern of increase in magnitude of open circuit photo-voltage corresponding to an increase in temperature of the photo-detector 102 can continue with respect to temperatures $T_4$, $T_5$, $T_6$, and $T_7$ and open circuit photo-voltages $V_{OC\_4}$, $V_{OC\_5}$, $V_{OC\_6}$, and $V_{OC\_7}$.

As illustrated in FIGS. 4A, 4B, 4C, and 4D, the direction of the photo-generated current 402, 404 (see FIGS. 4A and 4B) and polarity of open circuit photo-voltages $V_{OC}$ (see FIGS. 4C and 4D) switches to the opposite sign when the illumination condition is reversed between "positive" and "negative" illumination states. The electric power can be generated under either of the two alternative illumination scenarios. The energy that can be harvested includes but is no limited to solar radiation, as well as waste heat from industrial and/or residential buildings.

Experimentally, solar illumination was achieved by using the Class AAA solar simulator (ScienceTech, SS-1.6K) with a beam-down mirror to direct artificial sunlight to the photo-detectors 102. To simulate the one-sun illumination conditions, the solar simulator can be calibrated to output a flux of 1000 $Wm^{-2}$. Illumination by a blackbody heat, as well as, "negative" illumination of the photo-detectors 102, can be achieved, for example, by positioning the photo-detectors 102 inside a vacuum chamber and facing a temperature-controlled surface covered by the light absorbent foil (Metal Velvet, Edmund Optics), as shown on FIG. 2A.

Figure 5B:
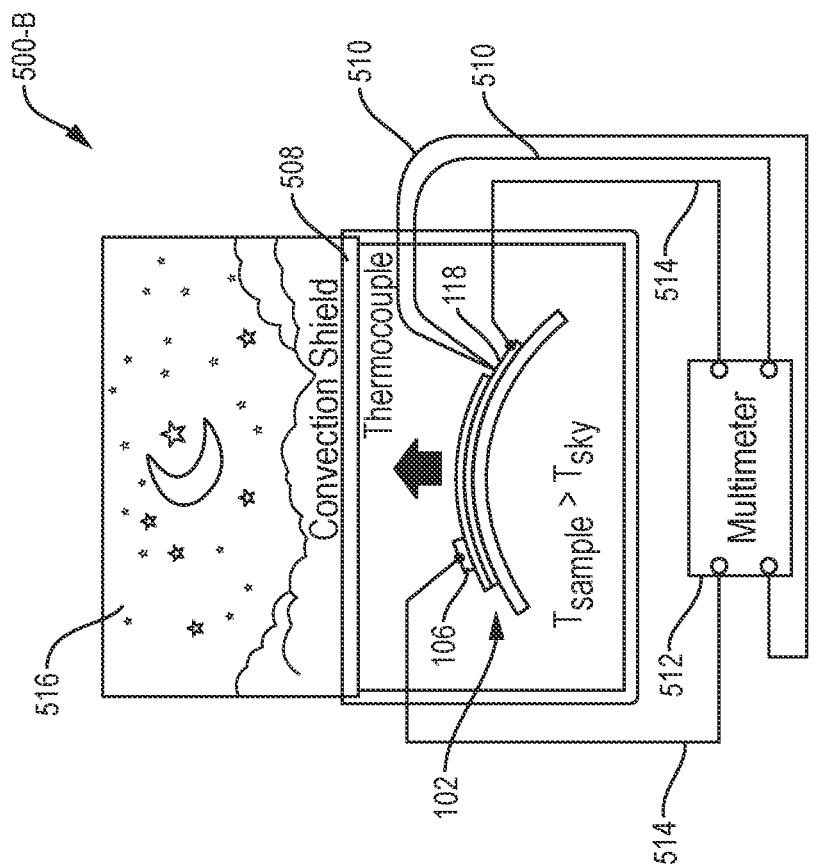
FIG. 5B is a schematic illustration of measuring infrared radiation emitted by the flexo-electric photo-detector of FIG. 1B while operating in the negative illumination regime of FIG. 4B.
Figure 5A:
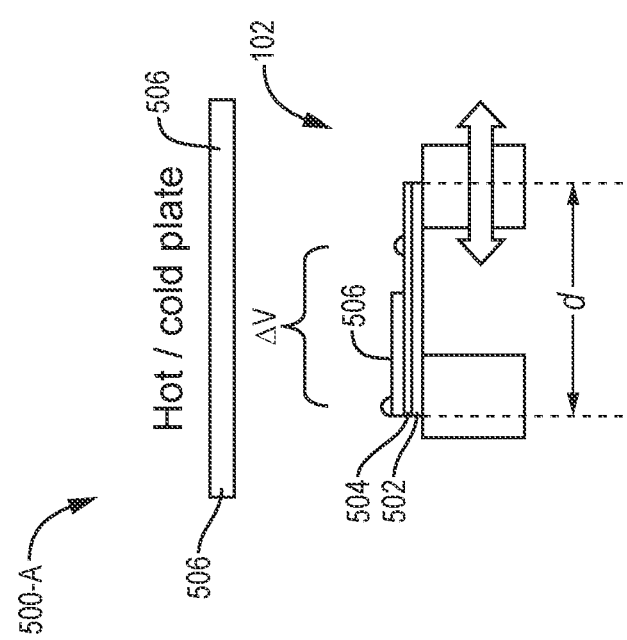
FIG. 5A is a schematic illustration of an arrangement for operating the flexo-electric photo-detector of FIG. 1B in the positive and negative illumination regimes of FIGS. 4A and 4B, respectively.

FIG. 5A illustrates example arrangement 500-A for observing operation of a photo-detector 102 in a positive illumination regime and a negative illumination regime. The arrangement 500-A includes positioning a hot/cold plate device 506 over the photo-detector 102. Heating the hot/cold plate device 506 up to a temperature ~10 K higher than a temperature of the photo-detector 102 can achieve "positive" blackbody heat illumination of the photo-detector 102. Cooling the hot/cold plate device 506 to a temperature ~10 K lower than a temperature of the photo-detector 102 can achieve "negative" illumination conditions, e.g., inducing the photo-detector 102 to emit infrared radiation towards a colder blackbody absorber. As discussed above, strain gradient applied to a given photo-detector 102 can be increased by progressively reducing the distance between opposite sides of a substrate to bend the films. As illustrated, for example, in FIG. 5A, progressively reducing the distance d between opposite sides 502, 504 of a substrate 506 to bend the films can increase strain gradient applied to the photo-detector 102, which, in turn, increases a size of the electric field inducted in the active layer.

FIG. 5B illustrates example arrangement 500-B for observing operation of the photo-detector 102 in the negative illumination regime by inducing the photo-detector 102 having a temperature of the room to emit infrared radiation towards a colder blackbody absorber, such as sky. In the arrangement 500-B of FIG. 5B, the photo-detector 102 is facing the cold sky 516, and may be covered by an infrared-transparent convection shield 508 to prevent cooling of the photo-detector 102 via air convection. Energy transfer indicative of the emission of the infrared radiation of the photo-detector 102 may be measured by connecting electrical leads 514 of a testing device 512 to the Ohmic contacts 106, 118 of the photo-detector 102, while measuring the temperature of the photo-detector 102 via attached thermocouples 510. The illustrated example of the testing device, as shown a multimeter, 512 includes a device configured to measure infrared radiation spectrum, such as but not limited to a pyrgeometer.

Figure 6:
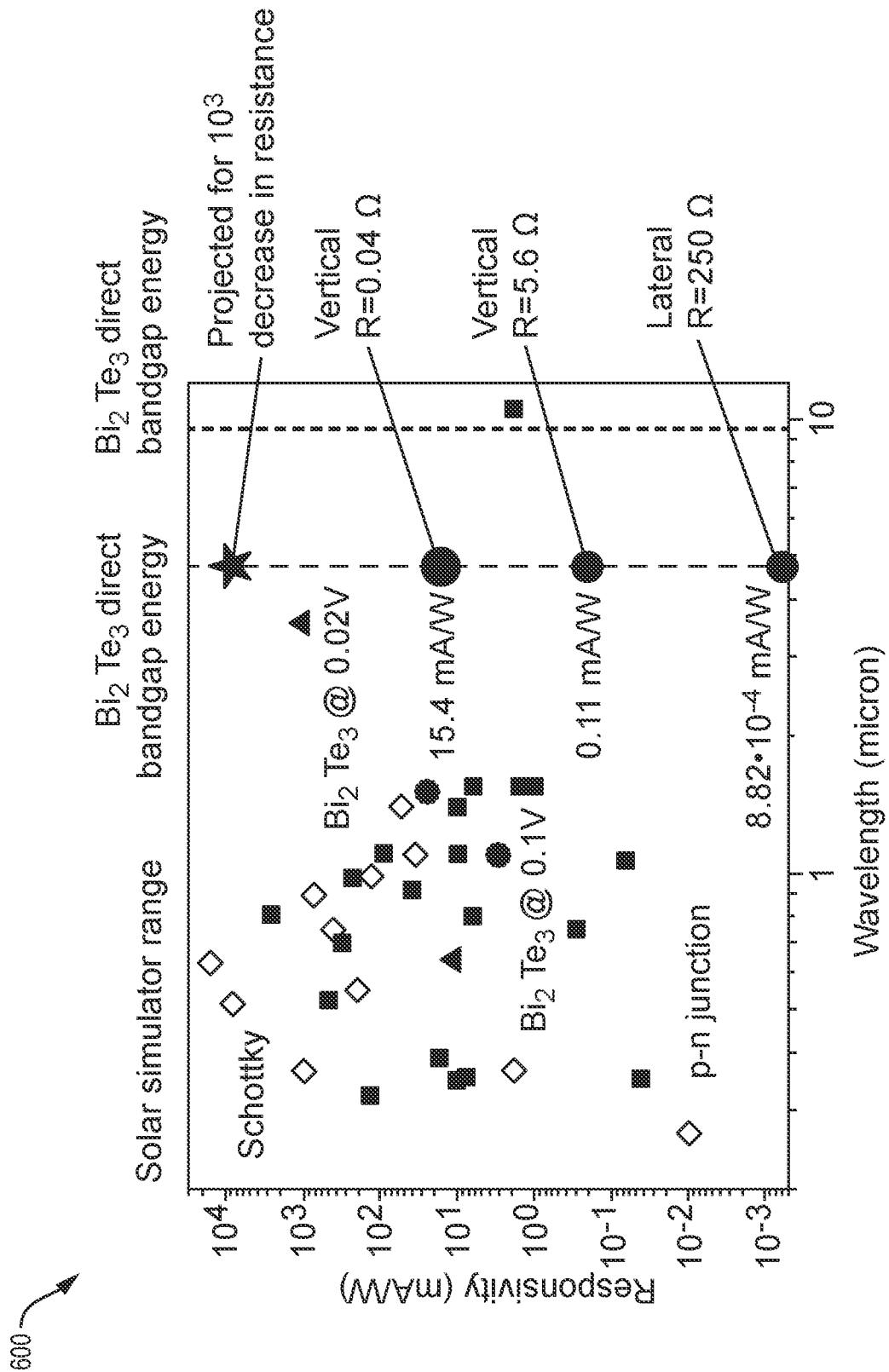
FIG. 6 is a graphical diagram illustrating current responsivity of the flexo-electric photo-detectors of FIGS. 1A, 1B, 2A, 2B, 3A, and 3B with respect to current responsivity of state-of-the art photo-detectors that use p-n or Schottky junctions.

FIG. 6 is a graph 600 illustrating current responsivity of several flexo-electric $Bi_2Te_3$ photo-detector prototypes (including the prototypes shown in FIGS. 2A and 2B) in the self-powered (i.e., no external bias applied) regime, at the room temperature, and under the maximum induced strain gradient. The corresponding current responsivity values of the self-powered photo-detectors 102 previously reported in the literature also are plotted for comparison. The traditional photo-detectors 102 are typically based on the p-n and Schottky junction photodiodes, whose current responsivity data are plotted as squares and diamonds, respectively. The data for previously demonstrated photo-detectors having the $Bi_2Te_3$ active layer when the traditional photo-detectors are operated under an externally applied bias in either photo-conductive regime (small circles) or photovoltaic (triangles) regime are also illustrated.

The diagram 600 of FIG. 6 illustrates that performance metrics of the flexo-electric sensor are at least comparable to those of other photovoltaic converter technologies, but at a fraction of the cost of many traditional implementations and without relying on junctions and/or without depending on an applied external bias. In combination with the lightweight and flexible nature of the flexo-electric photo-detector devices of the present disclosure, the observed room-temperature performance during the self-powered regime makes the flexo-electric photo-detectors an appealing solution for wearable technologies. Flexo-electric photo-detectors can perform in a spectral range inaccessible to other detector solutions.

Significant increase in current responsivity can be achieved in a vertical-generation implementation, which can combine thin-film single-crystalline material(s) exhibiting low resistance, optimized anti-reflection coating(s), optimized Ohmic contacts, and/or optimized deposition/annealing process(es). An example performance of such an implementation (predicted responsivity value) is plotted in FIG. 6. The predicted increase in responsivity is estimated solely based on the expected resistance reduction and absorptance increase relative to the first and second prototypes of FIGS. 2A and 2B. However, larger responsivity increase is likely owing to better material quality (i.e., higher charge carrier mobility), orders-of-magnitude enhancement of strain gradients on the nanoscale, and/or a possibility of the hot carrier collection. The exemplary implementations illustrated in FIGS. 2A and 2B include a polycrystalline $Bi_2Te_3$ film with low charge carrier mobility of 10 $cm^2V^{-1} S^{-1}$ undergoing a modest strain gradient of 0.89 $cm^{-1}$. For comparison, charge carrier mobility in single-crystalline $Bi_2Te_3$ exceeds 500 $cm^2V^{-1} S^{-1}$, which should translate into the corresponding improvement in the photocurrent.

It should also be noted that the data points illustrating the performance of the flexo-electric detector prototypes have been measured under the broadband spectra illumination (i.e., full solar spectrum and 350K blackbody thermal radiation, respectively). The responsivity is expected to be higher for a narrow-bandwidth laser light illumination in combination with the anti-reflective layer frequency- and polarization-selective design.

A non-limiting exemplary embodiment of the device can have maximum strain up to about 15% of the lattice constant, strain gradient up to about 3000 $m^{-1}$, and charge carrier mobility up to about $10^4$ $cm^2V^{-1} s^{-1}$. For reference, the prototypes shown in FIGS. 2A and 2B have maximum strain<about 3%, strain gradient<about 90 $m^{-1}$, and charge carrier mobility about 10 $cm^2V^{-1} s^{-1}$.

In some instances, a thickness of the active layer 104 can be approximately in the range of about 20 nm to about 2000 nm, such as, but not limited to, a thickness of about 1500 nm.

In some instances, exemplary device embodiments can incorporate active material that either has no electronic band gap (e.g., a semimetal) or has a band gap approximately in the range of about 0.01 eV to about 1 eV, such as, but not limited to, approximately in the range of about 0.01 eV to about 0.3 eV.

In some instances, the devices of the present disclosure can exhibit near-perfect photon absorptance in a frequency range just above the active material band gap, which can be achieved, for example, by deposition of anti-reflective coatings and/or other light-coupling structures (e.g., gratings, microlenses, or nano-antennas).

In some instances, the devices disclosed herein can incorporate active material with a large static dielectric constant (e.g., on the order of approximately in the range of about 10 to about $10^5$, such as, but not limited to, approximately in the range of about $10^3$ to about $10^5$). A list of several exemplary materials having a large corresponding static dielectric constant is shown in Table 1 illustrated in FIG. 7. The exemplary materials of Table 1 include HgCdTe, the state-of-the-art material in the infrared photo-detection, $BaTiO_3$, a wide-gap semiconductor known to exhibit a large flexo-electric effect, and a number of narrow-gap semiconductor materials that are characterized by high static dielectric constants and are useful for flexo-electric infrared photo-detection and energy generation. Other materials can also be used and a person skilled in the art, in view of the present disclosures, will understand various other materials that can be used effectively to achieve the desirable results made possible by the teachings herein.

The charge carriers in flexo-electric detectors can exhibit both diffusive and ballistic transport, the latter enabling fast (nanosecond-scale) photoresponse, where ballistic transport regime exhibited by a charge carrier results from at least one of a large polarization induced by the strain gradient applied to the active layer and by the asymmetry of the electronic bands in the active layer. Flexo-electric photo-detectors having thickness smaller than a predefined threshold enables a collection of charge carriers in the ballistic regime. Accordingly, as discussed in reference to at least FIG. 5A, thin-film materials having large strain gradients. e.g., strain gradients of at least $10^3$ $m^{-1}$, may be effective in designing photo-detectors consistent with the present disclosure. Such flexo-electric devices can be applied as broadband, low-cost, high-speed, self-powered, and/or flexible photo-detectors and/or strain sensors suitable for wearable applications. The flexo-electric photo-detectors of the present disclosure can also be used as high-efficiency low-cost CMOS-compatible detectors for long-range LIDAR suitable for micro-arraying and interfacing with Si readout integrated circuits. At least because flexo-electric photo-detectors exhibit polarization sensitivity, they offer opportunities for developing sensors for the polarization-sensitive LIDARS. The same devices under solar, terrestrial thermal, and/or "negative" illumination (i.e., radiating into the cold sky) can be used for solar and/or thermal energy harvesting beyond the SQ limit in the daytime and/or the nighttime. These flexo-electric broadband photodetectors and energy generators can also be fabricated from other materials, including but not limited to $Pb_xSn_{1-x}Se/Te$ and $Bi_2Te_{3-x}Se_x$ compounds, $SrTiO_3$, InAs, InSb, and other low-gap semiconductors, semimetals (including topological Weyl semimetals), and topological insulators with gapless surface states. These materials can be in the form of thin films, multi-layered heterostructures (e.g., quantum wells), fibers, integrated waveguide structures, etc.

One skilled in the art will appreciate further features and advantages of the disclosure based on the above-described embodiments. Accordingly, the disclosure is not to be limited by what has been particularly shown and described, except as indicated by the appended claims. All publications and references cited herein are expressly incorporated herein by reference in their entirety.

The invention claimed is:

1. A photo-detector comprising:
   at least one of a thin film or a heterostructure of photo-sensitive material; and
   a plurality of Ohmic contacts interfacing opposed sides of the at least one of the thin film or the heterostructure,
   wherein the at least one of the thin film or the heterostructure is configured to be under a strain gradient to induce shift current flow within the material to perform photo-detection in a frequency range that includes a mid-infrared frequency range.

2. The photo-detector of claim 1, wherein the photo-sensitive material comprises a semiconductor.

3. The photo-detector of claim 1, wherein the photo-sensitive material comprises a semi-metal.

4. The photo-detector of claim 1, wherein the photo-sensitive material comprises a $Bi_2Te_{3-x}Se_x$ compound.

5. The photo-detector of claim 1, wherein the photo-sensitive material comprises a $Pb_xSn_{1-x}Se/Te$ compound.

6. The photo-detector of claim 1, wherein the strain gradient is introduced by one of bending, micro-indentations, nano-indentations, deposition of straining overlayers, or substrates.

7. The photo-detector of claim 1, wherein the photo-detector is configured to operate in a self-powered regime in response to being exposed to radiation, the self-powered regime allowing the photo-detector to perform photo-detection to detect light energy without applied voltage or active cooling.

8. The photo-detector of claim 1, wherein the photo-detector is configured to operate in a self-powered regime in response to being exposed to radiation, the self-powered regime allowing the photo-detector to generate electric power.

9. The photo-detector of claim 1, wherein the photo-detector is configured to provide polarization sensitivity of detected light.

10. The photo-detector of claim 1, further comprising a frequency-selective anti-reflective coating.

11. The photo-detector of claim 10, wherein the frequency-selective anti-reflective coating is disposed between the plurality of Ohmic contacts.

12. A method comprising:
    inducing a strain gradient in an active layer of a photo-detector to induce shift current flow within the active layer, the photo-detector including a plurality of Ohmic contacts and a frequency-selective anti-reflective coating that is disposed between the plurality of Ohmic contacts, and
    generating energy during a negative illumination regime when the photo-detector is facing the sky.

13. The method of claim 12, further comprising performing photo-detection in a self-powered regime.

14. The method of claim 12, wherein inducing a strain gradient further comprises at least one of bending, forming micro-indentations, forming nano-indentations, or depositing straining overlayers or substrates.

15. The method of claim 12, further comprising performing photo-detection in a frequency range that includes a mid-infrared frequency range.

16. A photo-detector comprising:
    at least one of a thin film or a heterostructure of photo-sensitive material; and
    at least a pair of Ohmic contacts coupled to the at least one of the thin film or the heterostructure,
    wherein the at least one of the thin film or the heterostructure is configured to generate power in the negative illumination regime when the photo-detector is facing a cold body.

17. The photo-detector of claim 16, wherein the photo-sensitive material comprises a semiconductor.

18. The photo-detector of claim 16, wherein the photo-sensitive material comprises a semi-metal.

19. The photo-detector of claim 16, wherein the at least one of the thin film or the heterostructure is under a strain gradient.

20. The photo-detector of claim 16, wherein the cold body includes the sky, the photo-detector acts as a thermoradiative cell.

* * * * *